(12) United States Patent
Wu (10) Patent No.: US 7,824,974 B2
(45) Date of Patent: Nov. 2, 2010

(54) METHOD FOR MANUFACTURING A CONSTANT CURRENT SOURCE DEVICE

(75) Inventor: Wei-Kuo Wu, Guang Zhou Science City (CN)

(73) Assignee: Nanker (Guangzhou) Semiconductor Manufacturing Corp., Guangdong (CN)

( * ) Notice: Subject to any disclaimer, the term of this patent is extended or adjusted under 35 U.S.C. 154(b) by 105 days.

(21) Appl. No.: 12/252,469

(22) Filed: Oct. 16, 2008

(65) Prior Publication Data

US 2009/0134474 A1 May 28, 2009

(30) Foreign Application Priority Data

Nov. 28, 2007 (CN) .......................... 2007 1 0031759

(51) Int. Cl.
H01L 21/336 (2006.01)
(52) U.S. Cl. ............................... 438/197; 257/E27.061
(58) Field of Classification Search ................ 438/197, 438/291, E21.409, E21.631; 257/392, 402, 257/E27.061
See application file for complete search history.

(56) References Cited

U.S. PATENT DOCUMENTS 3,789,504 A * 2/1974 Jaddam ...................... 438/291

2002/0000568 A1 * 1/2002 Ohshima et al. ............ 257/175
2003/0173598 A1 * 9/2003 McKay et al. .............. 257/213

* cited by examiner

Primary Examiner—Sue Purvis
Assistant Examiner—Selim Ahmed
(74) Attorney, Agent, or Firm—Alan Kamrath; Kamrath & Associates PA (57) ABSTRACT

A constant current source device with over current and over voltage protection function can be directly applied to AC power and DC power, and a method for manufacturing the constant current source device is also disclosed. The device includes a silicon substrate (1), an oxide layer (6) formed in front of the silicon substrate (1), a drain metal (2), a source metal (3) and a gate metal (4) located in front of the oxide layer (6), a P+ guard ring (50), an N+ drain region (52) and an N+ source region (53) implanted in the silicon substrate (1), a P+ substrate region (51) located in the N+ source region (53), and an N– channel region (54) connecting the N+ drain region (52) with the N+ source region (53). The drain metal (2) and the source metal (3) are separately connected with the N+ drain region (52), the N+ source region (53) and the P+ substrate region (51). The source metal (3) and the gate metal (4) are electrically connected through a connection metal (7). The invention constant current source device is generally applied to the field of electronic devices.

1 Claim, 10 Drawing Sheets

METHOD FOR MANUFACTURING A CONSTANT CURRENT SOURCE DEVICE

BACKGROUND OF THE INVENTION

1. Field of the Invention

The present invention is related to a constant current source device and a method for manufacturing the constant current source device.

2. Description of the Related Art

"MOSFET" is an abbreviation of "metal-oxide-semiconductor field effect transistor" whose theorem is the foundation of modem IC (integration circuit) chips. A depletion mode MOSFET device comprises three basic portions: a source (S), a gate (G) and a drain (D). An N-channel depletion mode MOSFET has a shallow doped layer located close to the surface of the gate between the source and drain and with the same polarity as the source and drain. While the gate to source voltages are positive, the saturation conduction currents will increase as the gate to source voltages are raised. This character is the same as an enhancement mode MOSFET. However, while the gate and the source are at the same potential and the drain is applied with a positive bias, the depletion transistor may show passing through the rapid ascending linear region and then going into the constant current saturation region. The drain voltage at this point is called a saturation voltage. The drain saturated current level is related to the concentration and the depth of the shallow layer of the doped layer. Generally, the higher the concentration and the deeper the depths are, the larger the current will be. While the gate and the source are applied with a negative bias, the channel can be cut off, and the conduction current is zero. The gate voltage at this point is defined as a threshold voltage. However, if the concentration of the channel is too dense or the depth is too deep, the gate will be unable to cut off the channel current. While the voltage between the gate and the source is zero in the depletion mode MOSFET, the drain-source current has already shown to be constant current conductively. This character is inconvenient in the logic application when comparing with an enhancement mode MOSFET. Thus, the depletion mode MOSFET has not yet been used as an independent device in industry in the past. Since the depletion mode MOSFET has a characteristic of conduction while the gate voltage is zero and as the drain voltage is increased, the current basically stays in the saturation area till the drain breakdown, so it is suitable for the constant current source. For example, if the range of working voltage in the depletion MOSFET can be raised, that is, the breakdown voltage of the drain is raised to over 50 volts, the depletion mode MOSFET can be applied extensively as a constant current source with over voltage protection for the DC load which is connected directly with the AC power after regulating and filtering. If the drain's breakdown voltage of the depletion MOSFET is under 15 volts, the depletion MOSFET still can be used as a low voltage constant current source in the DC power, such as a constant current source for LED miners lamps.

In the practical application, although there is no need to have large power consumption for many loads, it often requires the electrical power maintaining the voltages and currents relatively stable within a certain range. At the same time, it requires certain over voltage and current protection functions for some critical elements within the loads. To solve these kinds of electricity supply issues within the load, a constant current or voltage stabilization power is normally adopted, and the over current protection circuit still needs to be added in the power circuit for some elements of the load under abnormal conditions. Thus, this will result in more power elements being required, in complex circuits, and in large proportion of wasted power under normal operation.

Currently, the applications for LEDs are becoming more and more popular, and LED lamps used for the indoor and outdoor lightening also are becoming more and more extensive. However, the current LED driving circuits all need to include the current stabilization circuit, which requires more circumferential components. Even though the luminance of the LED has better stability and smaller lighting brightness variation, the cost of the circumferential components is very high. Furthermore, the power consumption for the circumferential components has occupied 20-30% of the total power such that the advantages of energy conservation and power saving of the LED can not be fully elaborated. If a constant current source device is set to serially connect with the LED, it is able to solve the above problems. However, there currently is no such kind of independent constant current source device.

SUMMARY OF THE INVENTION

The objects of the present invention are to solve and overcome the deficiency in the present technology and to provide a constant current source device with over current and over voltage protection functions which can be applied to the AC and DC power supply. The constant current source device is applied to the LED lighting circuit and can save power consumption of the whole circuit.

The present invention provides a method for manufacturing the constant current source device.

In addition, a constant current source device is provided for the present invention. The constant current source device comprises a P-type silicon substrate, an oxide layer formed in front of the silicon substrate, a drain metal, a source metal and a gate metal located on top of the oxide layer, a P+ guard ring, an N+ drain region and an N+ source region implanted in the silicon substrate. A P+ substrate region is located in the N+ source region, and an N-channel region connects the N+ drain region with the N+ source region. The oxide layer comprises drain through holes, source N+ through holes, and P+ substrate through holes thereon. The drain metal fills in the drain through holes and is connected with the N+ drain region. The source metal fills in the source N+ through holes and the source P+ substrate through holes, respectively, and is connected with the N+ source region and the P+ substrate region, respectively. Also, the source metal and the gate metal are electrically connected through a connection metal.

The constant current source device further includes an N+ guard ring implanted in the silicon substrate. The N+ guard ring is located in the inner side of the P+ guard ring, and the N+ guard ring surrounds the N+ drain region or surrounds the N+ drain region and the N+ source region.

The drain metal, the source metal and the gate metal are aluminum, copper or a silicon-aluminum alloy.

The method for manufacturing the constant current source device of the present invention comprises:

(a) Thermal oxidizing a P-typed silicon substrate in the oxidation furnace to grow an oxide layer protecting film and, then, a first photo mask is utilized to process the photolithography in the photolithography machine. Also, a corrosive liquid containing the HF (hydrofluoric acid) is used to etch the oxide layer protecting film.

(b) Boron difluorides or boron ions are implanted in the P-type silicon substrate. Furthermore, the P+ guard ring and the P+ substrate region are formed by thermally driven-in.

(c) Using a second photo mask to process the photolithography in a photolithography machine. Furthermore, a dry etching method is used to etch the oxide layer. Then, an ion implanter is used to implant the arsenic ions or phosphorous ions in the silicon substrate. Furthermore, a heavily doped N+ region (i.e. the N+ drain region and N+ source region) is formed by thermally driven-in.

(d) Using a third photo mask to process the photolithography in a photolithography machine, and a corrosive liquid containing the HF (hydrofluoric acid) is used to etch the oxide layer. Furthermore, the dry thermal oxidation or wet thermal oxidation is used to form the gate, the source and the drain oxide layers. Then, the phosphorous ions or phosphorous ions and boron ions are implanted. Furthermore, an oxide layer and an N-channel region are formed by thermally driven-in.

(e) Using a fourth photo mask to process the photolithography in a photolithography machine. Furthermore, an etching method is used to etch the oxide layer and to form the drain through holes, the source N+ through holes and the source P+ substrate through holes.

(f) Sputtering or evaporating for depositing a metal layer. Then, a metal layer mask is utilized to process the photolithography in a photolithography machine. Furthermore, a dry or wet etching method is used to etch the metal layer and to form a drain metal, a source metal, a gate metal, and a connection metal.

After thermally driving-in in step (c), the N+ guard ring is simultaneously formed.

According to the present invention, a constant current source device includes a P-type silicon substrate, an oxide layer formed in front of the silicon substrate, a drain metal, a source metal and a gate metal located in front of the oxide layer. A P+ guard ring, an N+ drain region and an N+ source region are implanted in the silicon substrate. A P+ substrate region is located in the N+ source region, and an N– channel region connecting connects the N+ drain region with the N+ source region. The oxide layer comprises drain through holes, source N+ through holes and P+ substrate through holes thereon. The drain metal fills in the drain through holes and is connected with the N+ drain region. The source metal separately fills in the source N+ through holes and the source P+ substrate through holes and is separately connected with the N+ source region and the P+ substrate region. Also, the source metal and the gate metal are electrically connected through the connection metal. That is, the present invention constructs a depletion mode FET that can maintain a conductive status without exerting a voltage on the gate, can act as an independent constant current source device and can conveniently exchange the current circumferential voltage stabilizing and current stabilizing circuits. Thus, the numbers of circuitry components are fewer, and the circuitry is simpler. Therefore, the constant current source device in accordance with the present invention can directly be applied to AC power and DC power and has the protection functions for over current and over voltage. If applied to the LED lighting circuit, it can save power consumption of the whole circuit. Due to the same reason, the manufacturing method of the present invention has the aforementioned advantages. The method of the present invention is simple, and the products produced by the method have better quality.

The constant current source device according to the present invention further includes an N+ guard ring implanted in the silicon substrate. The N+ guard ring is located in the inner side of the P+ guard ring, and the N+ guard ring surrounds the N+ drain region or surrounds the N+ drain region and the N+ source region. The N+ guard ring can further raise the voltage-resisting value of the constant current source device. Therefore, the constant current source device of the present invention has a better over voltage protection ability.

BRIEF DESCRIPTION OF TIE INVENTION

DETAILED DESCRIPTION OF THE PREFERRED EMBODIMENT

First Embodiment

Figure 1:
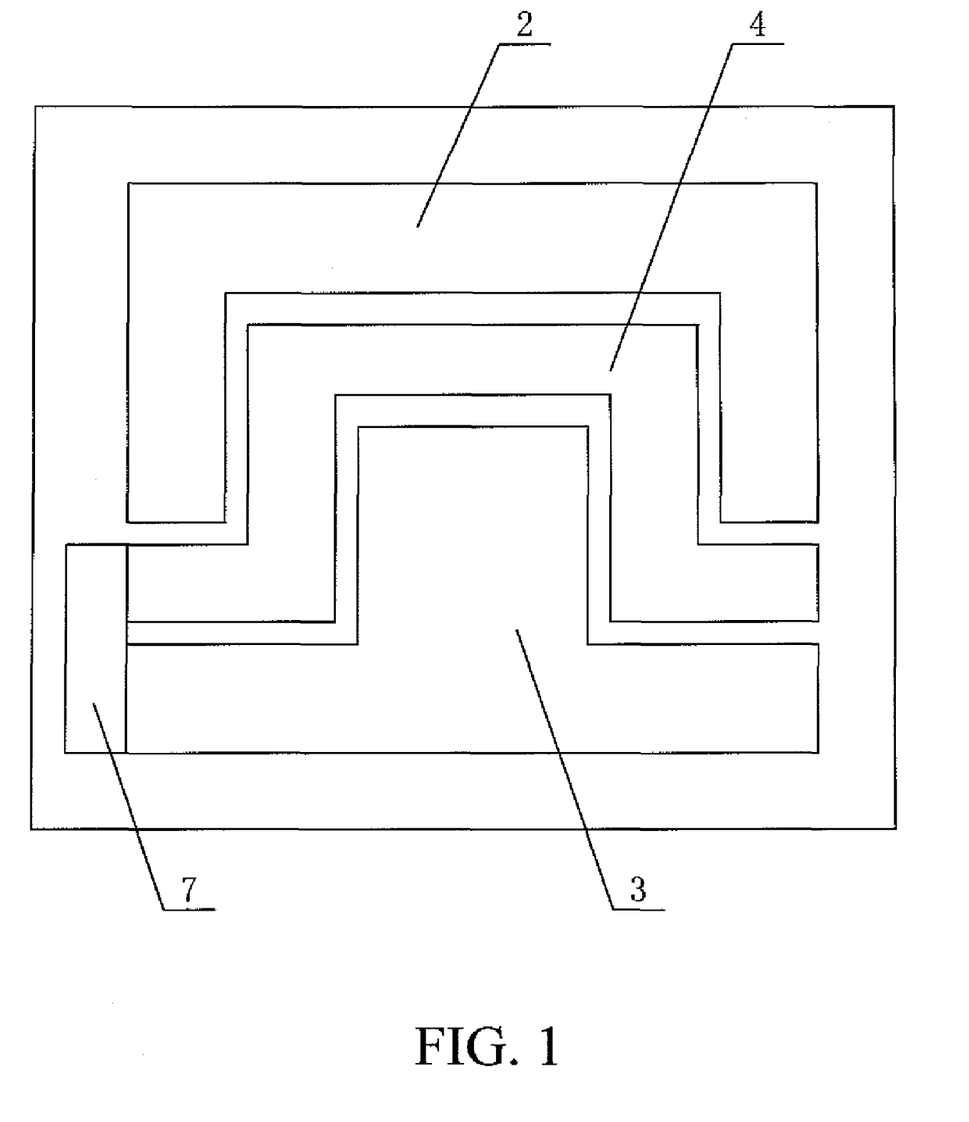
FIG. 1 is a front view of the constant current source device in accordance with the present invention.
Figure 2:
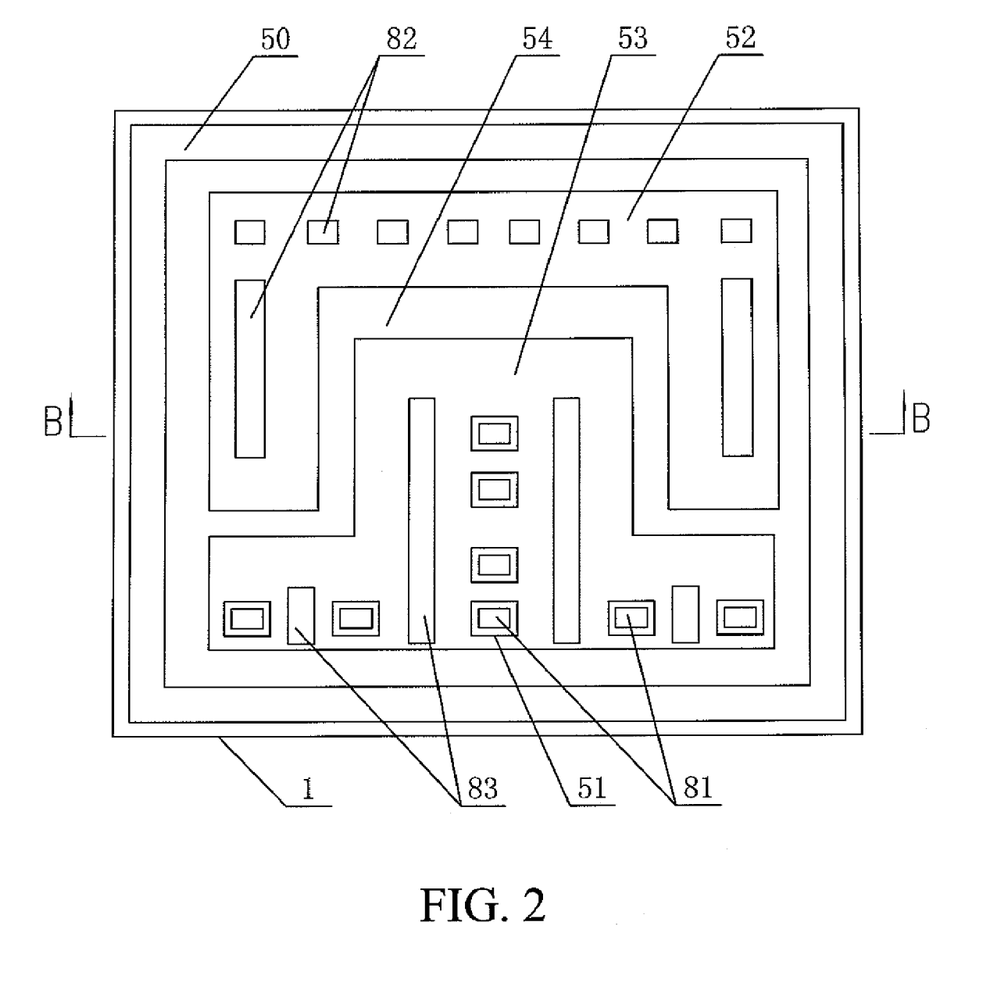
FIG. 2 is an A-A sectional diagram of FIG. 3 in accordance with a first embodiment of the constant current source device of the present invention.
Figure 3:
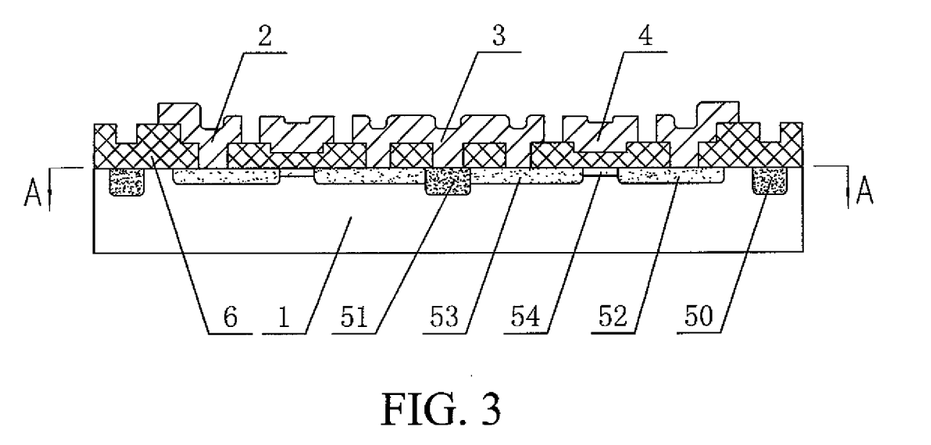
FIG. 3 is a B-B sectional diagram of FIG. 2 in accordance with the first embodiment of the constant current source device of the present invention.

As shown in FIGS. 1-3, a constant current source device in accordance with the present embodiment includes a P-type silicon substrate 1, an oxide layer 6 formed in front of the silicon substrate 1, a drain metal 2, a source metal 3 and a gate metal 4 located in front of the oxide layer 6. A P+ guard ring 50, an N+ drain region 52 and an N+ source region 53 are implanted in the silicon substrate 1. A P+ substrate region 51 is located in the N+ source region 53. An N– channel region 54 connects between the N+ drain region 52 and the N+ source region 53. The oxide layer 6 comprises drain through holes 82, source N+ through holes 83 and P+ substrate through holes 81 thereon. The drain metal 2 fills in the drain through holes 82 to connect with the N+ drain region 52. The source metal 3 separately fills in the source N+ through holes 83 and the source P+ substrate through holes 81 and is separately connected with the N+ source region 53 and the P+ substrate region 51. The source metal 3 and the gate metal 4 are electrically connected through a connection metal 7. The drain metal 2, the source metal 3 and the gate metal 4 are aluminum. Alternatively, copper or a silicon-aluminum alloy can be adopted for the drain metal 2, the source metal 3 and the gate metal 4.

The present invention provides a depletion mode FET that can maintain a conductive status without exerting a voltage on the gate, can act as an independent constant current source device and can conveniently replace the current circumferential voltage and current stabilizing circuits.

Alternatively, the substrate 1 can also be an N-type. In this embodiment, although the polarity of guard ring 50 is kept unchanged and still is the P+ guard ring 50, the rest of characteristics along with polarity are all reversed. For example, the substrate region 51 is changed into N+ substrate region 51, the drain region 52 is changed into P+ drain region 52, the source region 53 is changed into P+ source region 53, and the channel region 54 is changed into P− channel region 54. This condition ought to be an equivalent characteristic of the present invention.

Figure 4:
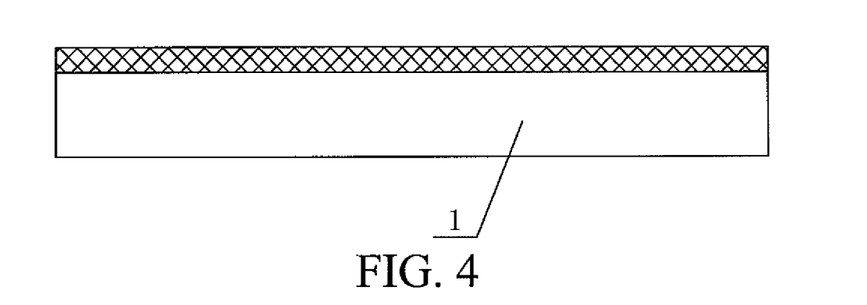
FIGS. 4-12 are sectional diagrams of the first embodiment of the constant current source device, which show a method of the present invention for manufacturing the constant current source device.
Figure 5:
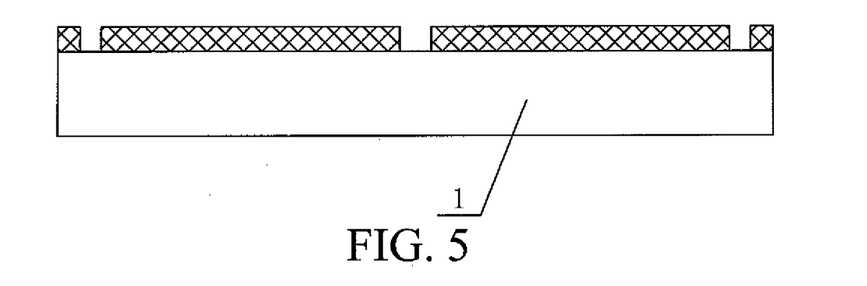

As shown in FIGS. 3-12, a method for manufacturing the constant current source device in accordance with the present embodiment includes the following steps:

(a) The P-type silicon substrate 1 is thermal oxidized in the oxidation furnace to grow an oxide layer protecting film with a thickness of 3000 angstroms. The thickness of the oxide layer protecting film can be controlled within 1000-5000 angstroms. Then, a first photo mask is utilized to process the photolithography in a photolithography machine, and a corrosive liquid containing the HF (hydrofluoric acid) is used to etch the oxide layer protecting film. This step is shown in FIGS. 4 and 5.

Figure 6:
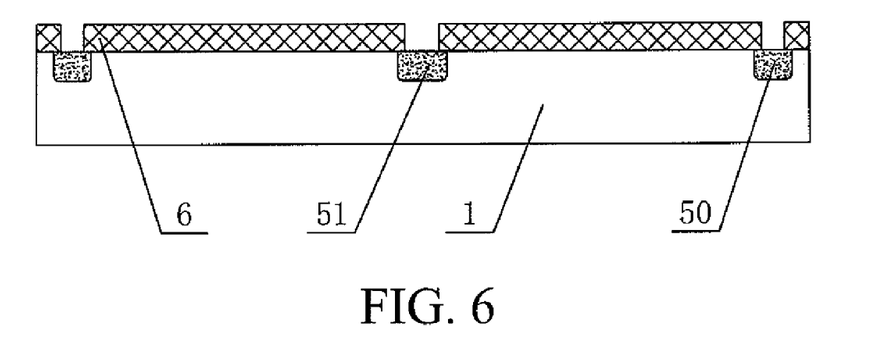
Figure 7:
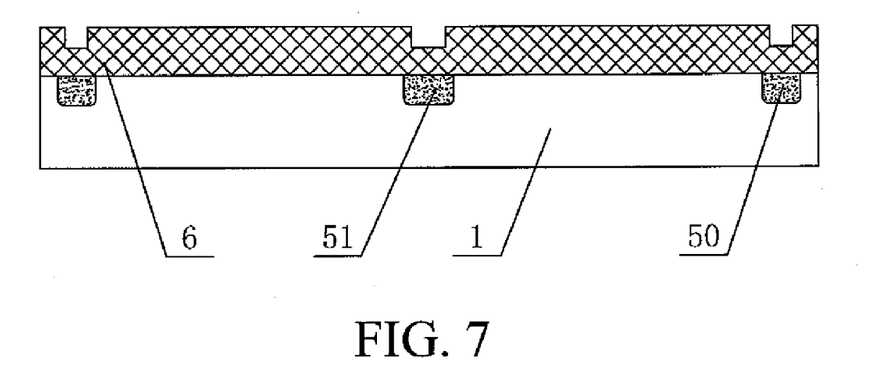

(b) The P-type boron ions are implanted in the silicon substrate 1 by the dose of $1\times10^{14}/cm^2 - 5\times10^{15}/cm^2$ under the energy of 50-200 keV. Furthermore, they are thermally driven-in for 30 minutes to 10 hours under the temperature of 1000-1150° C. to form the oxide layer with a thickness of 1000-5000 angstroms, P+ guard ring 50 and the P+ substrate region 51. Alternatively, the boron difluorides can be adopted for the implantation of the P-type ions. This step is shown in FIGS. 6 and 7.

Figure 8:
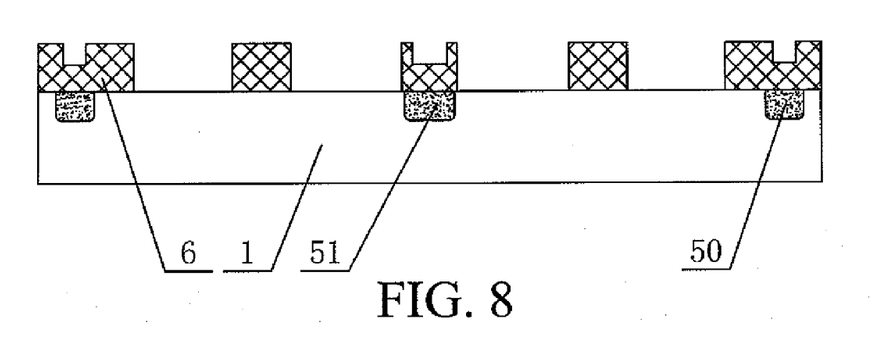
Figure 9:
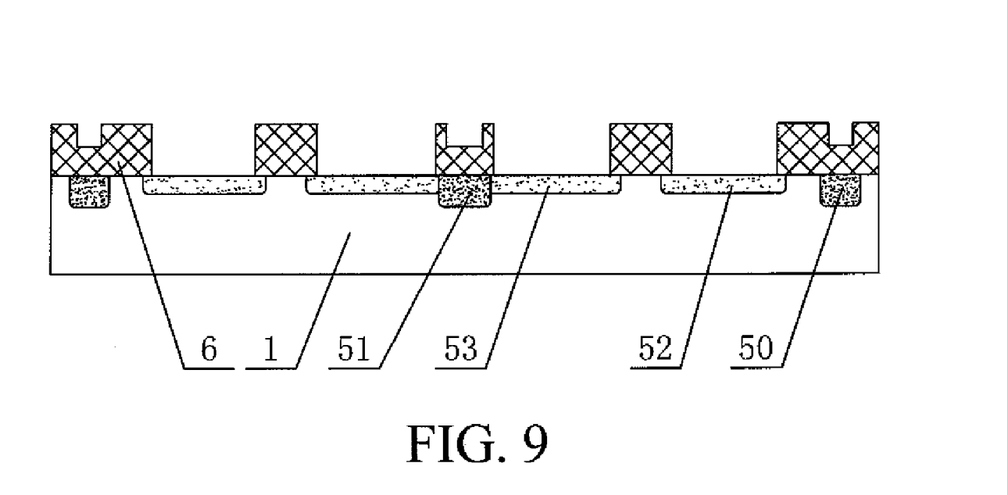

(c) A second photo mask is used to process the photolithography in a photolithography machine. Furthermore, a dry etching method is used to etch the oxide layer. Then, an ion implanter is used to implant the arsenic ions in the silicon substrate 1 by the dose of $1\times10^{15} - 5\times10^{16}/cm^2$ under the energy of 50-100 keV. In another embodiment, besides the aforementioned arsenic ions, the phosphorous ions can be additionally implanted in the silicon substrate 1 by the dose of $1\times10^{13} - 5\times10^{15}/cm^2$ under the energy of 50-100 keV. The aforementioned implantation of arsenic ions and phosphorous ions at the same time is due to the diffusion speed of phosphorous ion being faster than that of the arsenic ions and the dose of the phosphorous ion also being lower than that of the arsenic ions. Thus, the voltage-resisting ability between the source and the drain can be raised. Furthermore, they are thermally driven-in for 30 minutes to 3 hours under the temperature of 900-1150° C. to form the heavily doped N+ region, that is, the N+ drain region 52 and N+ source region 53. This step is shown in FIGS. 8 and 9.

(d) A third photo mask is used to process the photolithography in a photolithography machine, and a corrosive liquid containing the HF (hydrofluoric acid) is used to etch the oxide layer of gate region. Furthermore, the wet thermal oxidation under the temperature of 800-1000° C. is used to form the source and drain's oxide layers and gate oxide layer. Due to the source region and the drain region being heavily doped (N-type), the source and drain's oxide layer is thicker than that of the gate oxide layer. Then, the phosphorous ions are implanted by the dose of $1\times10^{10} - 5\times10^{13}/cm^2$ under the energy of 50-200 keV. In another embodiment, except the aforementioned phosphorous ions and the boron ions can be further implanted by the dose of $1\times10^{10} - 5\times10^{12}/cm^2$ under the energy of 80-200 keV. The implantation of boron ions can increase the substrate concentration in the channel to avoid the punch through between the drain and source, which should be conductive only for the surface channel. Furthermore, they are thermally driven-in for 10 minutes to 60 minutes under the temperature of 1000-1150° C. to form the oxide layer 6 and the N− channel region 54.

Figure 10:
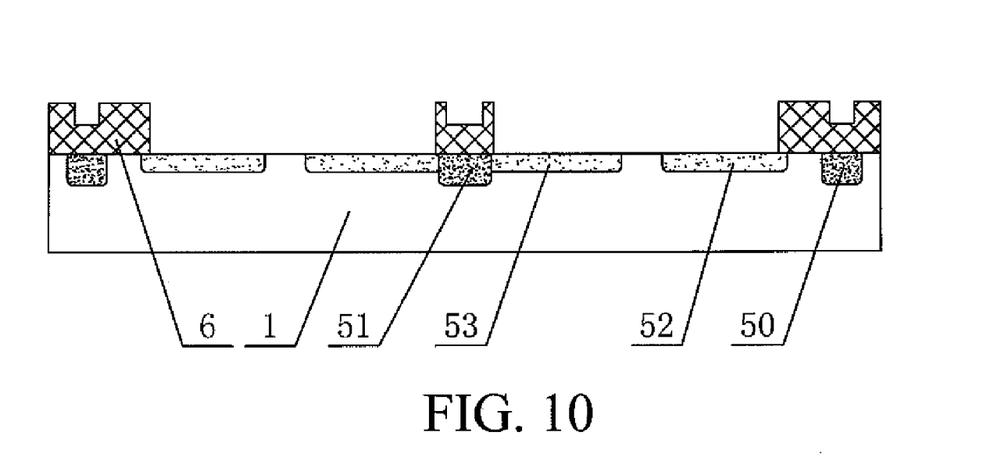
Figure 11:
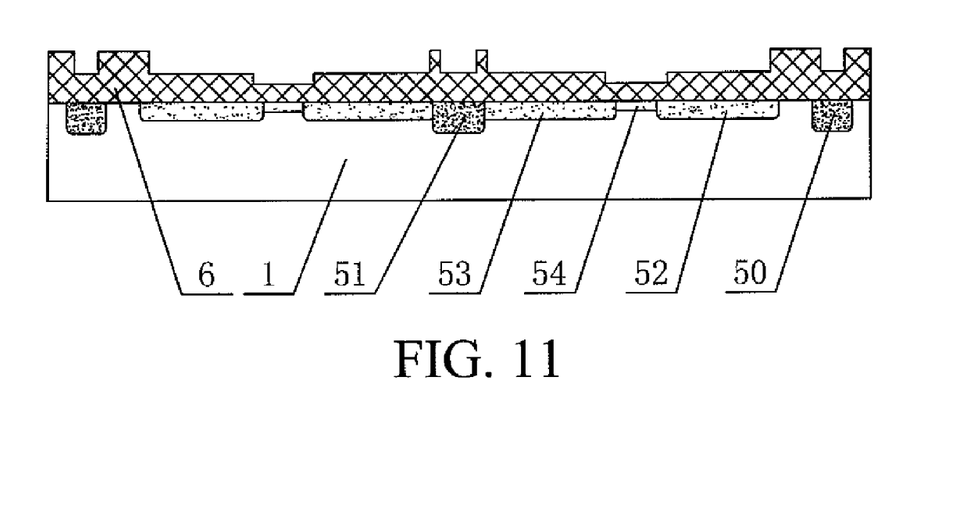

(e) Finally, the guard ring 50, the P+ substrate region 51, the N-channel region 54 and the oxide layer 6 are formed. This step is shown in FIGS. 10 and 11.

Figure 12:
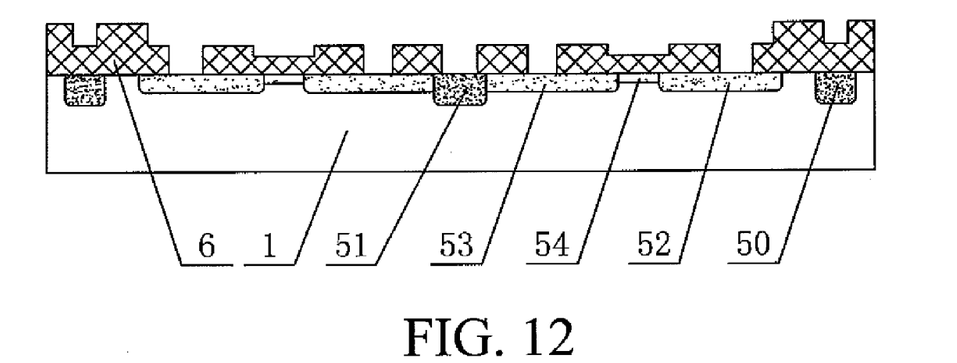

(f) A fourth photo mask is used to process the photolithography in a photolithography machine. Furthermore, an etching method is used to etch the oxide layer 6 in order to form the drain through holes 82, the source N+ through holes 83 and the source P+ substrate through holes 81. This step is shown in FIG. 12.

(g) A sputtering or evaporation method is used to deposit a metal layer with a thickness of 10000 angstroms, which has a preferred embodiment range controlled between 5000-30000 angstroms. Then, a metal layer mask is utilized to process the photolithography in a photolithography machine. Furthermore, a dry etching method is used to etch the metal layer. Alternatively, a wet etching method can be adopted for etching to form the drain metal 2, the source metal 3, the gate metal 4, and the connection metal 7. In this step, the finally formed sectional drawing is shown in FIG. 3.

Figure 13:
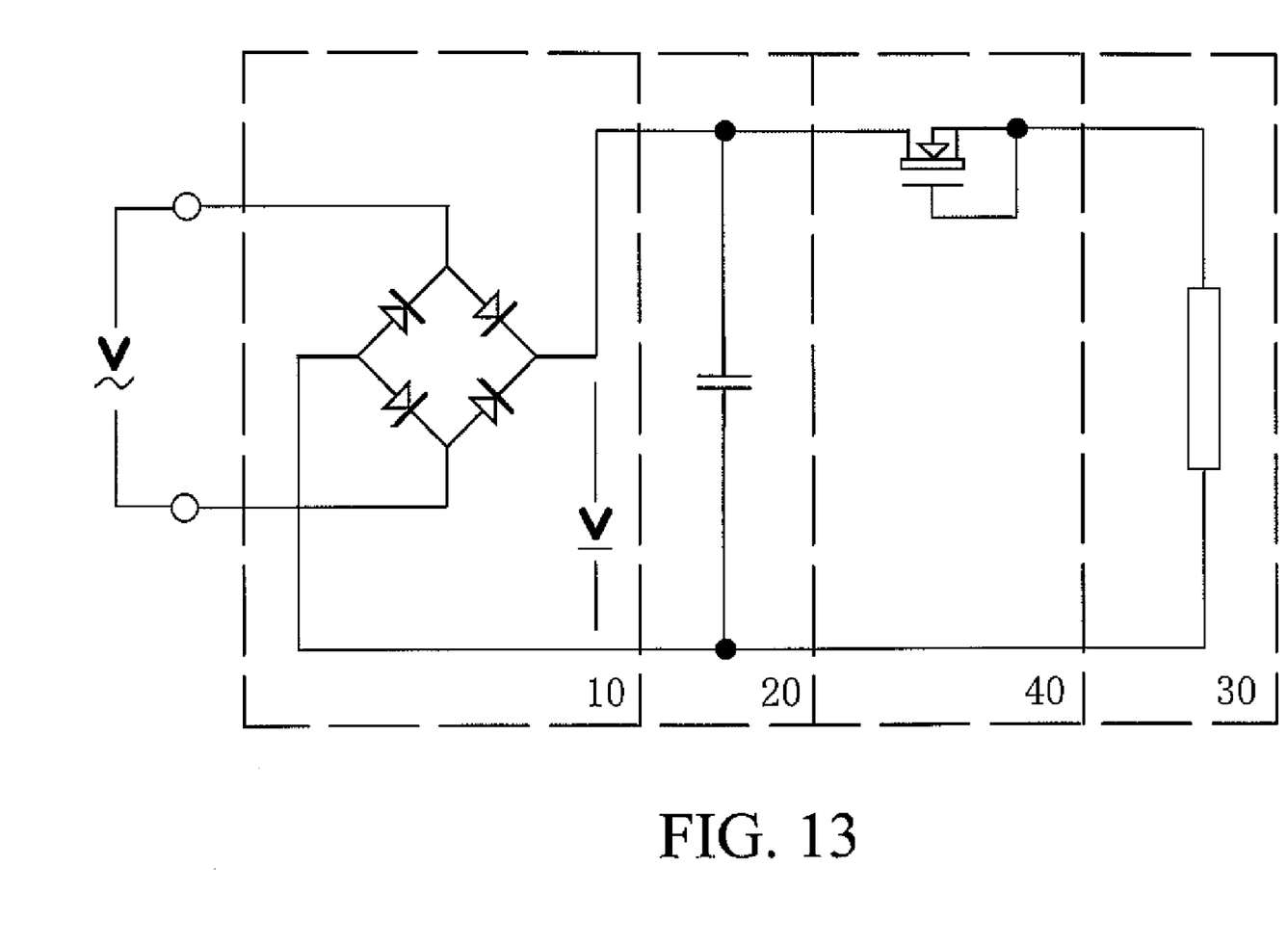
FIG. 13 is a diagram of an application circuit in accordance with the constant current source device of the present invention.

FIG. 13 shows an application circuit in the constant current source device of the present invention. The circuit includes a regulating circuit 10, a filtering capacitor 20 and a load 30. The circuit also includes a depletion mode FET 40 (i.e. the constant current source device in the present invention). An input of the regulating circuit 10 is connected with AC power. The regulating circuit 10 is parallel connected with the filtering capacitor 20. The drain of the depletion mode FET 40 is connected with one end of the DC output of the regulating circuit 10. The source and the gate of the depletion mode FET 40 are parallel connected and connected with one end of the load 30. The other end of the load 30 is connected with another end of the DC output of the regulating circuit 10. The load 30 can be a lamp composed of the LED (light emitting diode) elements or several LED elements that are serial connected or serial-parallel connected. Alternatively, series of LEDs can be serial connected such that the total voltage-resisting ability is close to but lower than the DC voltage after regulating. Then, the positive pole end of the LED elements is connected with the source/gate of the constant current source device of the present invention, and the drain of the constant current source device is connected with the positive pole after regulating and filtering. The saturation current of the gate and the source under the same potential of the constant current source device of the present invention can be adjusted according to the current requirement in the LED elements. Thus, a constant current can be provided to the LED elements. While the AC voltage is unstable and especially is higher than normal voltage, the part of over voltage will be added in between the drain and the source of the constant current source device in accordance with the present invention without influencing the LED elements. It, thus, can achieve the objects to protect the LED elements by voltage stabilization and protection function. If the AC voltage is lower than the normal voltage, the part of under voltage will firstly lower the voltage between the drain and the source of the depletion FET, and, then, the redundant part will be equally shared by every the serial connected LEDs. This causes no damage to the LED except causing the decrease in the current passing through the LED and, furthermore, causes no meaningless power consumption. Therefore, it can make the LED elements intrinsically achieve the objects of energy conservation and power saving. For every white light LED working under 3.2 volts/30 mA (milli-ampere), if whole 96 LEDs are serial connected together, the total voltage is about 307.2 volts, and the output of the 220 volts AC is about 311V after being regulated and filtered. Therefore, if the drain with an output current of 30 mA in the constant current source device is connected to the output of regulating and filtering and if the source and the gate are connected to the positive pole end of the LED elements, the load between the drain and the source of the constant current source device will be about 3.88 volts. Also, the power consumption of the whole circuit will be about 9.33 watts (=96×3.2×0.03+3.88×0.03). The loss in the constant current source device is only 0.116 watts (=3.88×0.03). The loss is only 1.2% of the total power consumption. Due to [[that]] the variation in AC voltage being between plus and minus 30 volts, the variation after regulating and filtering is between plus and minus 45 volts. If the voltage resisting ability of the constant current source device can reach more than 50 volts, the constant current source device can provide the over voltage protection function for the LED elements while the AC power's voltage is unstable. While applied in the LED lighting circuit, it can furthermore save the power consumption of the whole circuit. Alternatively, the load 30 can also be another circuit with high working voltage, a DC electric motor with high working voltage, a thermal load with high resistivity, etc. While applied to those other circuits, the constant current source device in accordance with the present invention also has the aforementioned advantages.

Figure 14:
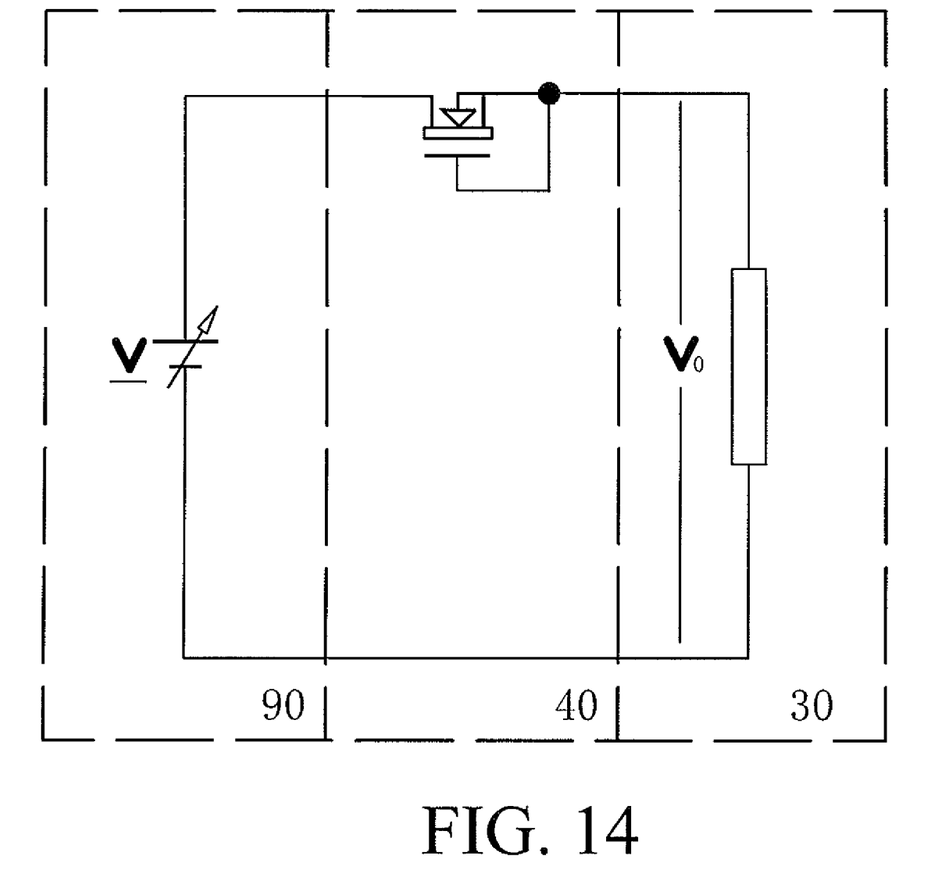
FIG. 14 is a diagram of another application circuit in accordance with the constant current source device of the present invention.

FIG. 14 shows another application circuit of the constant current source device in accordance with the present invention. The application circuit includes a variable DC power 90, a load 30 composed of LED elements, and a depletion mode FET 40 (i.e. the constant current source device of the present invention). An output end in the positive pole of the variable DC power 90 is connected with the drain of the constant current source device of the present invention. The source and the gate of the constant current source device of the present invention are connected with the positive pole of the load 30. A Negative pole in the load 30 and a Negative pole in the variable DC power 90 are connected together. Due to the saturation voltage of an ordinary N− type depletion FET 40 is about 1-3 volts, the constant current source device in accordance with the present invention can provide the protection for the LED load while the output voltage range of the DC power 90 is between $(1.0+V_0)$ and $(0.8 \times V_{breakdown}+V_0)$.

Second Embodiment

Figure 15:
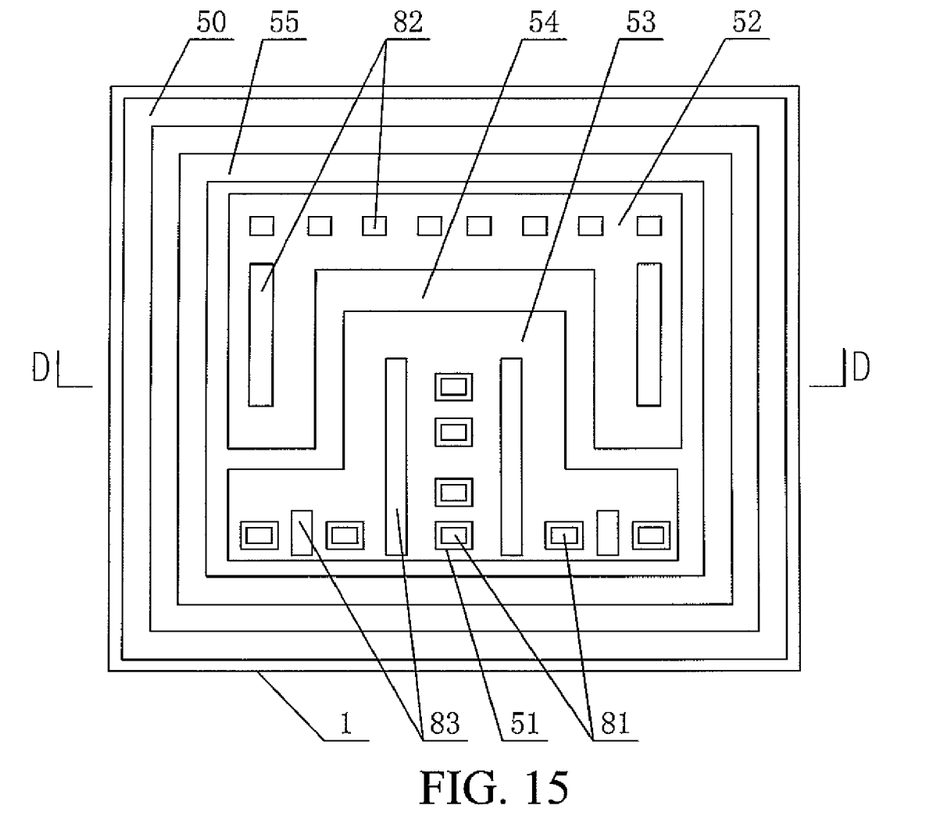
FIG. 15 is a C-C sectional diagram of FIG. 16 in accordance with a second embodiment of the constant current source device of the present invention.
Figure 16:
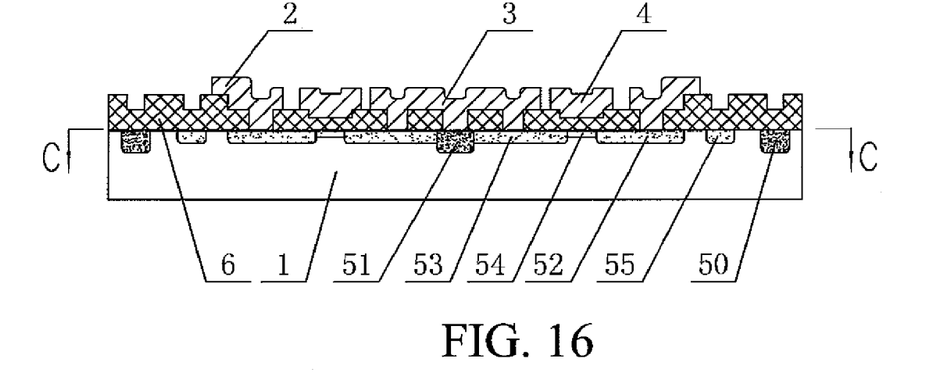
FIG. 16 is a D-D sectional diagram of FIG. 15 in accordance with the second embodiment in the constant current source device of the present invention.

As shown in FIGS. 1, 15 and 16, the difference of the constant current source device between the second embodiment and the first embodiment is: the constant current source device in the second embodiment further includes an N+ guard ring 55 implanted in the silicon substrate 1. The N+ guard ring 55 is located in the inner side of the P+ guard ring 50. The N+ guard ring 55 will surround the N+ drain region 52 and the N+ source region 53. The N+ guard ring 55 can further raise the voltage-resisting value in the constant current source device such that the constant current source device can have better over voltage protection.

The difference in the method to manufacture the constant current device between the second embodiment and the first embodiment is: after thermally driving-in in step (c), the N+ guard ring 55 is simultaneously formed.

The other characteristics in the second embodiment can be same as those of the first embodiment.

Third Embodiment

Figure 17:
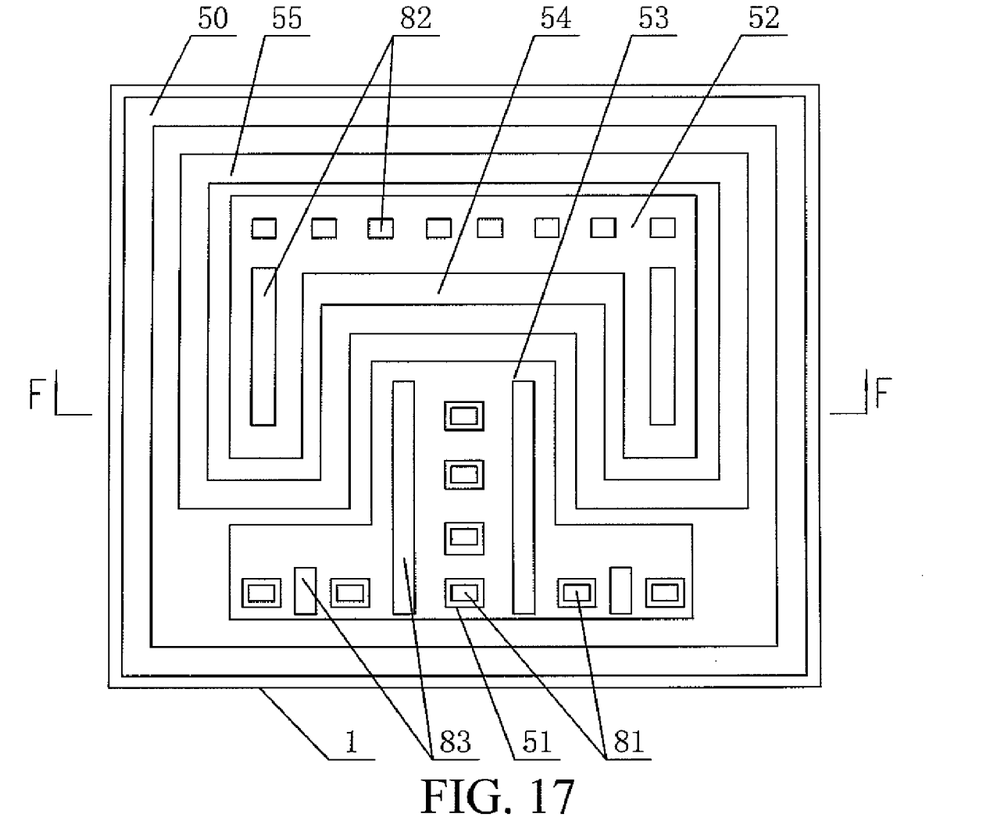
FIG. 17 is an E-E sectional diagram of FIG. 18 in accordance with a third embodiment in the constant current source device of the present invention.
Figure 18:
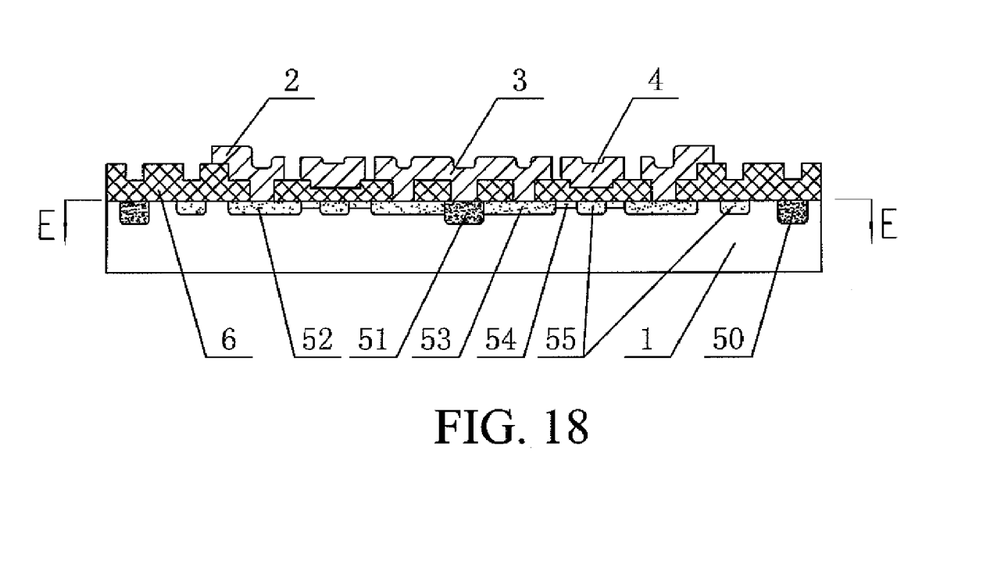
FIG. 18 is an F-F sectional diagram of FIG. 17 in accordance with the third embodiment in the constant current source device of the present invention.

As shown in FIGS. 1, 17 and 18, the difference between the third embodiment and the second embodiment is: the different surrounding positions of N+ guard ring 55 of the constant current source device of the present embodiment. The N+ guard ring 55 in the third embodiment surrounds the N+ drain region 52 and has the same effect as the second embodiment.

The other characteristics in the third embodiment are the same as those of the second embodiment.

The quantities of the P+ guard ring 50 and the N+ guard ring 55 of the constant current source device can be several and are not be limited to the quantities shown in the aforementioned embodiments or drawings.

The present invention can generally be applied to the field of electronic devices.

Although the present invention has been explained in relation to its preferred embodiments, it is to be understood that many other possible modifications and variations can be made without departing from the spirit and scope of the invention as hereinafter claimed.

What is claimed is:

1. A method for manufacturing a constant current source device comprising:

(a) thermally oxidizing a P-type silicon substrate in an oxidation furnace to grow an oxide layer protecting film, providing a first photo mask on the oxide layer protecting film and processing in a photolithography machine, and using a corrosive liquid containing a HF (hydrofluoric acid) to etch the oxide layer protecting film;

(b) implanting boron difluorides or boron ions in the P-type silicon substrate and forming a P+ guard ring and a P+ substrate region by thermally driven-in;

(c) providing a second photo mask on the oxide layer protecting film and processing in the photolithography machine, etching the oxide layer protecting film by dry etching method, implanting arsenic ions or arsenic ions and phosphorous ions in the P-type silicon substrate, forming a heavily doped N+ region comprising an N+ drain region and an N+ source region after thermal driven-in and forming a N+ guard ring simultaneously after thermally driving-in;

(d) providing a third photo mask on the oxide layer protecting film and processing in the photolithography machine, and using the corrosive liquid containing the HF (hydrofluoric acid) to etch the oxide layer protecting film, using a dry thermal oxidation or a wet thermal oxidation at high temperature to form gate, source and drain oxide layers, then implanting phosphorous ions or phosphorous ions and boron ions, followed by high temperature drive-in;

(e) providing a fourth photo mask on the oxide layer protecting film and processing in the photolithography machine, etching the oxide layer protecting film with dry etch or wet etch processes to form drain through holes, source N+ through holes, and source P+ substrate through holes; and (f) depositing a metal layer by sputtering or evaporation, using a metal layer mask on the metal layer and processing in the photolithography machine, and etching the metal layer and forming a drain metal, a source metal, a gate metal, and a connection metal by a dry or wet etching method.

\* \* \* \* \*